United States Patent
Basu et al.

(10) Patent No.: US 10,784,542 B2
(45) Date of Patent: Sep. 22, 2020

(54) SYSTEM AND METHOD WITH BATTERY MANAGEMENT

(71) Applicant: SAMSUNG ELECTRONICS CO., LTD., Suwon-si (KR)

(72) Inventors: Suman Basu, Bangalore (IN); Ashwini Kumar Sharma, Bangalore (IN); Mohan Kumar Singh Verma, Bangalore (IN); Rajkumar Subhash Patil, Bangalore (IN); Tae Won Song, Yongin-si (KR); Young Hun Sung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/155,142

(22) Filed: Oct. 9, 2018

(65) Prior Publication Data

US 2019/0221897 A1    Jul. 18, 2019

(30) Foreign Application Priority Data

Aug. 7, 2017 (IN) .............................. 201741028028
Jan. 16, 2018 (IN) .............................. 201841001836
Jun. 26, 2018 (KR) ....................... 10-2018-0073266
Aug. 6, 2018 (IN) .............................. 201741028028

(51) Int. Cl.
*H01M 10/48* (2006.01)
*G01R 31/367* (2019.01)
*H02J 7/00* (2006.01)
*H01M 10/42* (2006.01)

(52) U.S. Cl.
CPC ........ *H01M 10/482* (2013.01); *G01R 31/367* (2019.01); *H02J 7/0021* (2013.01); *H01M 2010/4271* (2013.01)

(58) Field of Classification Search
CPC ........ H01M 10/482; H01M 2010/4271; G01R 31/367; H02J 7/0021
See application file for complete search history.

(56) References Cited

U.S. PATENT DOCUMENTS

| | | | |
|---|---|---|---|
| 2012/0130691 A1 | 5/2012 | Li et al. | |
| 2012/0130692 A1* | 5/2012 | Li | H01M 10/00 703/2 |
| 2016/0023566 A1 | 1/2016 | Lee | |
| 2019/0088976 A1* | 3/2019 | Li | H01M 10/00 |

FOREIGN PATENT DOCUMENTS

| | | |
|---|---|---|
| CN | 106469807 A | 3/2017 |
| EP | 3136118 S1 | 3/2017 |
| JP | 2006-300692 A | 11/2006 |
| JP | 2006-331671 A | 12/2006 |
| JP | 2009-106027 A | 5/2009 |
| KR | 10-1487494 B1 | 1/2015 |

* cited by examiner

*Primary Examiner* — Stacy Whitmore
(74) *Attorney, Agent, or Firm* — NSIP Law

(57) ABSTRACT

A processor-implemented battery management method includes iteratively determining fractions of components in an electrode of a battery; calculating a composite state of charge (SoC) of the battery by applying the iteratively determined fractions of the components to a composite cathode model used to predict a state of the battery; and predicting the state of the battery based on the calculated composite SoC.

22 Claims, 15 Drawing Sheets

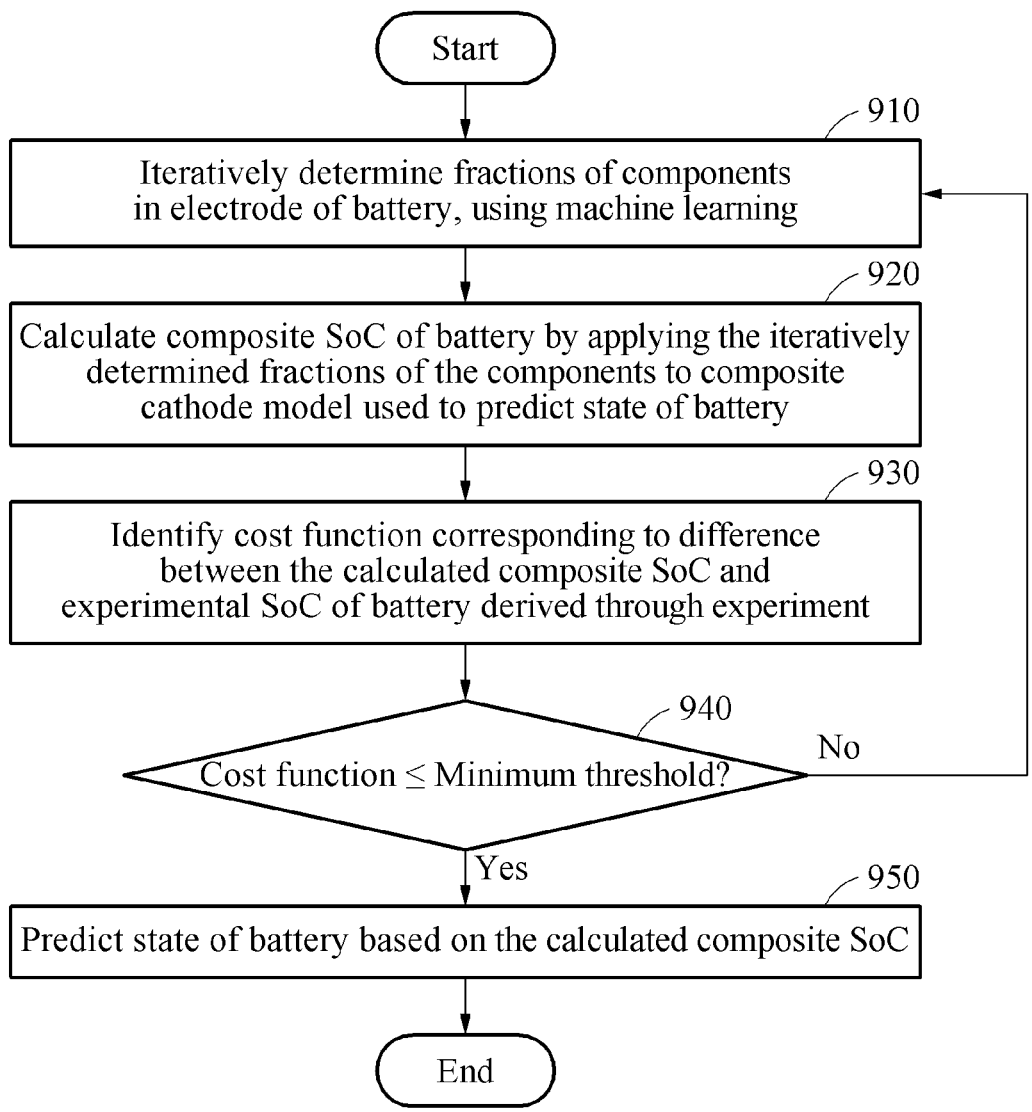

SYSTEM AND METHOD WITH BATTERY MANAGEMENT

CROSS-REFERENCE TO RELATED APPLICATIONS

This application claims the benefit under 35 U.S.C. § 119(a) of Indian Patent Application No. 201741028028 filed on Aug. 7, 2017 in the Intellectual Property INDIA (a petition under 37 C.F.R. § 1.55(c) is filed concurrently herewith), Indian Patent Application No. 201841001836 filed on Jan. 16, 2018 in the Intellectual Property INDIA, Indian Patent Application No. 201741028028 filed on Aug. 6, 2018 in the Intellectual Property INDIA, and Korean Patent Application No. 10-2018-0073266 filed on Jun. 26, 2018 in the Korean Intellectual Property Office, the entire disclosures of which are incorporated herein by reference for all purposes.

BACKGROUND

1. Field

The following description relates to a system and method with battery management.

2. Description of Related Art

Recently, a battery management system (BMS) performs battery management based on an equivalent circuit model of a battery. However, components of the equivalent circuit model may vary depending on internal or external conditions of the battery. Thus, an accuracy of the equivalent circuit model may be inadequate and may vary based on ad-hoc fitting parameters and internal or external conditions in which the equivalent circuit model is tested.

Although it is impossible to directly determine fractions of components in an electrode of a battery, all possible combinations of the fractions of the components may typically need to be tested to determine the fractions of the components. However, as the number of components increases, complexity in determination of fractions of the components increases.

Also, to determine parameters of battery cells included in a battery pack, traditionally, individual equations for each of the battery cells may need to be separately solved. However, such a process of separately solving the individual equations for each of the battery cells is a tedious and time-consuming process, and may not be implemented or available for real world or real-time battery management.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a processor-implemented battery management method including: iteratively determining fractions of components in an electrode of a battery; calculating a composite state of charge (SoC) of the battery by applying the iteratively determined fractions of the components to a composite cathode model used to predict a state of the battery; and predicting the state of the battery based on the calculated composite SoC.

The composite SoC may be iteratively calculated based on the fractions of the components, a concentration of each of the components, and an individual SoC of each of the components.

The calculating of the composite SoC may include: identifying a result of a cost function corresponding to a difference between the calculated composite SoC and an experimental SoC of the battery that is derived through an experiment; and determining whether to redetermine the fractions of the components, by comparing the identified result of the cost function to a predetermined threshold.

The determining of whether to redetermine the fractions of the components may include determining the iteratively determined fractions of the components as accurately-determined fractions of the components, in response to the identified result of the cost function being less than or equal to the threshold.

The determining of whether to redetermine the fraction of the components may include determining to redetermine the fractions of the components, in response to the identified result of the cost function being greater than the threshold, and the iteratively determining of the fractions of the components comprises redetermining the fractions of the components based on previously-determined fractions of the components, a rate of change in the previously-determined fractions, a rate of change in previously-determined results of the cost function identified based on the previously-determined fractions, and a learning rate, in response to a determination to redetermine the fractions of the components.

The predicting of the state of the battery may include predicting states of batteries other than the battery in a battery pack.

The predicting of the states of the other batteries may include predicting the states of the other batteries based on a change in an active material and a change in a composite SoC between the battery and the other batteries.

The method may further include calculating at least one of an intercalation rate and a deintercalation rate of lithium (Li)-ions based on a non-uniformity of a reaction rate based on a thickness of the electrode, wherein the predicting of the state of the battery comprises predicting the state of the battery based on either one or both of the calculated intercalation rate and the calculated deintercalation rate.

The method may further include managing the battery based on the predicted state of the battery.

A non-transitory computer-readable recording medium may store instructions that, when executed by one or more processors, cause the one or more processors to perform the method.

In another general aspect, there is provided a battery management system including: one or more processors configured to: iteratively determine fractions of components in an electrode of a battery; calculate a composite state of charge (SoC) of the battery by applying the iteratively determined fractions of the components to a composite cathode model used to predict a state of the battery; and predict the state of the battery based on the calculated composite SoC.

The composite SoC may be iteratively calculated based on the fractions of the components, a concentration of each of the components, and an individual SoC of each of the components.

The processor may be configured to: identify result of a cost function corresponding to a difference between the calculated composite SoC and an experimental SoC of the battery that is derived through an experiment; and determine whether to redetermine the fractions of the components, by comparing the identified result of the cost function to a predetermined threshold.

The processor may be configured to determine the iteratively determined fractions of the components as accurately-determined fractions of the components, in response to the identified result of the cost function being less than or equal to the threshold.

The processor may be configured to: determine to redetermine the fractions of the components, in response to the identified result of the cost function being greater than the minimum threshold; and redetermine the fractions of the components based on previously-determined fractions of the components, a rate of change in the previously-determined fractions, a rate of change in previously-determined results of the cost function identified based on the previously-determined fractions, and a learning rate, in response to a determination to redetermine the fractions of the components.

The processor may be configured to predict states of batteries other than the battery in a battery pack.

The processor may be configured to predict the states of the other batteries based on a change in an active material and a change in a composite SoC between the battery and the other batteries.

The processor may be configured to: calculate at least one of an intercalation rate and a deintercalation rate of lithium (Li)-ions based on a non-uniformity of a reaction rate based on a thickness of the electrode; and predict the state of the battery based either one or both of the calculated intercalation rate and the calculated deintercalation rate.

The system may further include memory storing instructions that, wherein when executed by the one or more processors, configure the one or more processors to perform the determination, the calculation, and the prediction of the system.

In another general aspect, there is provided a battery management method including: iteratively applying fractions of components in an electrode of a battery to a composite electrode model, and updating the fractions of the components based on a result of the applying; determining conclusory fractions of the components based on the iterative applying and updating of the fractions of the components; and determining a composite SoC of the battery by applying the determined conclusory fractions of the components to the composite electrode model.

The determining of the conclusory fractions of the components may include determining fractions of the components, from among the iteratively updated fractions of the components, to be the conclusory fractions of the components based on a result of a cost function of the composite electrode model with the updated fractions of the components applied, and the cost function is based on a difference between the composite SoC determined by applying the updated fractions of components to the composite electrode model and an SoC predetermined by experiment.

In another general aspect, there is provided a battery management method including: determining a preliminary composite state of charge (SoC) of a battery by applying fractions of components in an electrode of the battery to a composite electrode model; determining a result of a cost function based on a difference between the determined preliminary composite SoC and an SoC predetermined by experiment; updating the fractions of the components based on a comparison of the result of the cost function to a predetermined threshold; and determining a conclusory composite SoC of the battery by applying the updated fractions of components in an electrode of the battery to the composite electrode model.

Other features and aspects will be apparent from the following detailed description, the drawings, and the claims.

BRIEF DESCRIPTION OF THE DRAWINGS

FIG. 9 is a flowchart illustrating an example of a battery management method.

Figure 1:
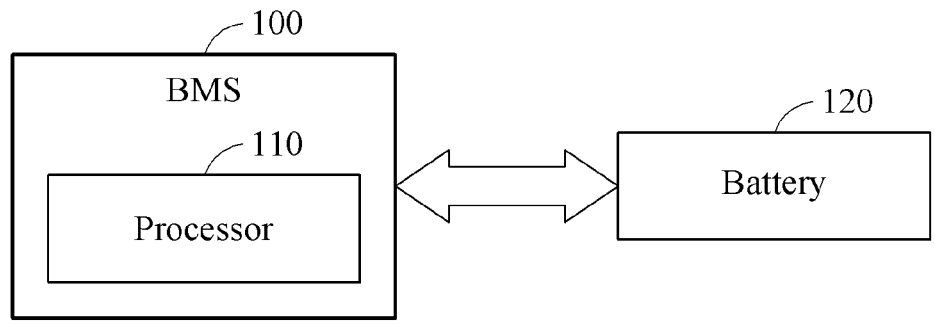
FIG. 1 illustrates an example of a battery management system (BMS) including a battery and a processor to predict a state of the battery.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The following structural or functional descriptions of examples disclosed in the present disclosure are merely intended for the purpose of describing the examples and the examples may be implemented in various forms. The examples are not meant to be limited, but it is intended that various modifications, equivalents, and alternatives are also covered within the scope of the claims.

As used herein, the singular forms are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Regarding the reference numerals assigned to the elements in the drawings, it should be noted that the same elements will be designated by the same reference numerals, wherever possible, even though they are shown in different drawings. Also, in describing of examples, detailed description of well-known related structures or functions will be omitted when it is deemed that such description will cause ambiguous interpretation of the present disclosure.

FIG. 1 illustrates an example of a battery management system (BMS) including a processor to predict a state of a battery.

Referring to FIG. 1, a BMS 100 based on physics includes a processor 110 and may perform battery management with respect to a battery 120 located separately from the BMS 100. The processor 110 may include one or more processors. The battery 120 may include one or more battery cells or battery packs. In another example, the BMS 100 is representative of including the battery 120. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto. The processor 110 predicts a state of the battery 120 under different operating conditions. The processor 110 determines at least one of parameters, for example, a voltage, a current, a state of charge (SoC) and a state of health (SoH), of the battery 120, to predict the state of the battery 120. For example, the processor 110 predicts a state of the battery 120 wherein the battery 120 is a lithium (Li)-ion battery, however, the present disclosure is not limited thereto. That is, the battery 120 may be any other type of battery other than and in addition to a Li-ion battery, and accordingly, the processor 110 may predict state of all types of batteries, other than and as well as a Li-ion battery.

The processor 110 iteratively determines fractions of components in an electrode (e.g., an anode or a cathode) of the battery 120 including a composite (e.g., blended) electrode, using machine learning. A fraction of a given component may indicate, for example, the percentage or proportion of the electrode that is made up by the given metallurgical, material, element, and/or chemical components. Accordingly, for example, a sum of all of the fractions of all the components of an electrode may be equal to 1, indicating the total composition of the electrode. The components in the electrode may include, e.g., any one or any combination of any two or more of lithium iron phosphate, lithium iron manganese, lithium nickel dioxide, and/or any other appropriate material or compound, as non-limiting examples. Also, the processor 110 provides and/or utilizes a composite cathode model used to predict a state of the battery 120 based on the fractions of the components that are iteratively determined based on the machine learning. The composite cathode model is implemented on, for example, a reduced order model (ROM).

For example, a voltage range ($V_{max}$, $V_{min}$) of the battery is divided into "n" voltage with equal levels. In this example, an open-circuit voltage (OCV) is denoted by $V^j$ (j=1, 2, ..., n). When a cathode is assumed to include "m" components, an individual SoC of a component "i" at the OCV $V^j$ is denoted by $SoC_i^j$, and $SoC_i^j$ is regarded to be known.

Also, a composite SoC at $V^j$ in which all the "m" components are taken into consideration is denoted by $SoC^j$, is calculated using the composite cathode model, and is expressed using Equation 1 shown below.

Equation 1:

$$SoC^j = \frac{\sum_{i=1}^{m1} SoC_i^j c_i^{max} fr_i}{\sum_{i=1}^{m1} c_i^{max} fr_i}$$

In Equation 1, $fr_i$ denotes a fraction of the component "i" of the cathode, and $c_i^{max}$ denotes a maximum concentration of the component "i," which is known already.

An experimental SoC at the OCV $V^j$ acquired using an experimental method is denoted by $SoC_{exp}^j$. A value of $SoC_{exp}^j$ is predetermined by experiment, for example. The processor 110 compares $SoC^j$ calculated using the composite cathode model to $SoC_{exp}^j$ acquired using the experimental method, to verify a validity of the fraction $fr_i$ of the component "i". The processor 110 identifies, based on a comparison result, a cost function corresponding to a difference between the calculated composite SoC $SoC^j$ and the experimental SoC $SoC_{exp}^j$, compares the identified cost function to a predetermined minimum threshold, and determines whether to redetermine the fractions of the components in the electrode of the battery.

For example, the cost function is defined as shown in Equation 2 below.

Equation 2:

$$Cost = \frac{1}{2m} \sum_{j=1}^{n} (SoC^j - SoC_{exp}^j)^2$$

The processor 110 iteratively determines the fraction $fr_i$ of the component "i" to minimize a value of the identified cost function using Equation 2. The cost function may be minimized using Equation 3 shown below.

Equation 3:

$$fr_i^{k+1} = fr_i^k - \alpha \frac{\partial \text{cost}}{\partial fr_i} \text{ where,} \quad (3a)$$

$$\frac{\partial \text{cost}}{\partial fr_i} = \frac{1}{m} \sum_{j=1}^{n} (SoC^j - SoC_{exp}^j) \frac{\partial SoC^j}{\partial fr_i} \text{ where,} \quad (3b)$$

$$\frac{\partial SoC^j}{\partial fr_i} = \frac{SoC_i^j c_i^{max} \sum_{i=1}^{ml} c_i^{max} fr_i - c_i^{max} \sum_{i=1}^{m} SoC_i^j c_i^{max} fr_i}{\left(\sum_{i=1}^{m} c_i^{max} fr_i\right)^2} \quad (3c)$$

In Equation 3, $fr_i^k$ denotes a fraction of the component "i" at a k-th iteration. Initially, a value of the fraction $fr_i^k$ is selected, and the selected value of the fraction $fr_i^k$ is substituted in Equation (3a) to determine a fraction of the component "i" at a (k+1)-th iteration. Also, α denotes a learning rate.

For example, when a cathode as an electrode of the battery is assumed to include three components at predetermined fractions, a value of "i" is "1," "2" and "3," and a value of $fr_i^k$ is selected for each i=1, 2 and 3. Also, the value of $fr_i^k$ is substituted in Equation 1 to obtain the composite SoC $SoC^j$. In this example, because the experimental SoC $SoC_{exp}^j$ has a known value, $SoC^j$ acquired using Equation 1 is substituted in Equation 2 to obtain the cost function. In an example, when a value of the obtained cost function is less than or equal to the minimum threshold, values of $fr_i^k$ for i=1, 2, and 3 are regarded as actual (or accurate) fractions of components in the cathode.

In another example, when the value of the obtained cost function is greater than the minimum threshold, the processor 110 determines to redetermine fractions of the components in the cathode. In this example, $fr_i^{k+1}$, that is, the redetermined fractions of the components are determined again based on the values of $fr_i^k$ selected for i=1, 2, and 3. Also, $fr_i^{k+1}$ is determined using Equations (3b) and (3c). For example, $fr_i^{k+1}$ is redetermined based on previously determined fractions (for example, $fr_i^k$) of the components, a rate of change in the previously determined fractions of the components, a rate of change in a cost function identified based on the previously determined fractions of the components, and a learning rate.

A value of a redetermined fraction $fr_i^{k+1}$ of each of the components is substituted again in Equation 1, to acquire $SoC^j$. At the (k+1)-th iteration, a value of $SoC^j$ is closer to $SoC_{exp}^j$. Thus, through further iterations, the value of the cost function is minimized to reach the minimum threshold. When the value of the cost function reaches the minimum threshold, a value of $fr_i$ is regarded to correspond to an actual (or accurate) fraction of each of the components in the cathode.

FIG. 1 illustrates an example of a unit of the BMS 100, however, other examples are not limited thereto. In another example, the BMS 100 includes a smaller number or a larger number of units than a number of units of FIG. 1. Also, labels or names of the units are used only for illustrative purposes, and do not limit the scope of examples in the present disclosure. One or more units in the BMS 100 are combined together to perform the same or substantially similar functions. In an example, the BMS 100 may also be representative of a mobile device, or vehicle, and thus also be representative of the additional components of the mobile device and vehicle examples.

Examples disclosed herein may be implemented through one or more processors or a specialized hardware device, e.g., that when executing computer-readable instructions, may thereby be configured to perform any, any combination, or all operations described herein. The BMS 100 is also representative of included hardware that may be configured to implement a network management function to control network elements and implement the battery management. The BMS 100 is further representative of an included memory storing such instructions. The memory may further store parameters of any machine learning model that may be implemented by the processor 110. A network element shown in FIG. 1 may include a block that may be any one or any combination of a hardware device or a combination of one or more processors.

FIGS. 2A through 2D are graphs illustrating examples of a cathode OCV obtainable by iteratively determining fractions of components in an electrode of a battery.

As described above, the processor 110 of FIG. 1 provides a composite cathode model used to predict a state of a battery based on the fractions of the components that are iteratively determined using the machine learning. The composite cathode model is implemented on a ROM. A machine learning method is used to calculate a composite SoC based on fractions of the components enhanced by iteratively determining the fractions of the components, and to compare the composite SoC to an experimental SoC acquired using an experimental method. The machine learning method is applicable to OCV shape matching based on the same voltage of all components of a cathode.

Figure 2A:
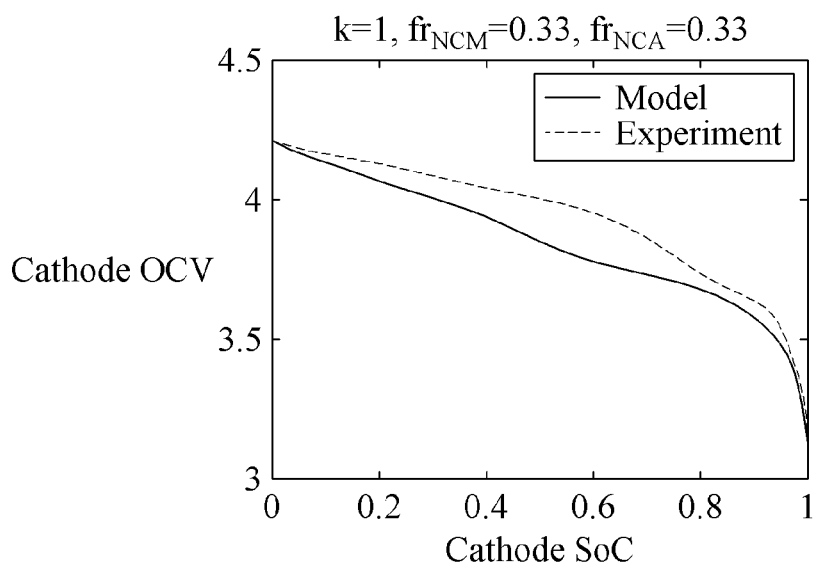
FIGS. 2A through 2D are graphs illustrating examples of a cathode open-circuit voltage (OCV) obtainable by iteratively determining fractions of components in an electrode of a battery.
Figure 2B:
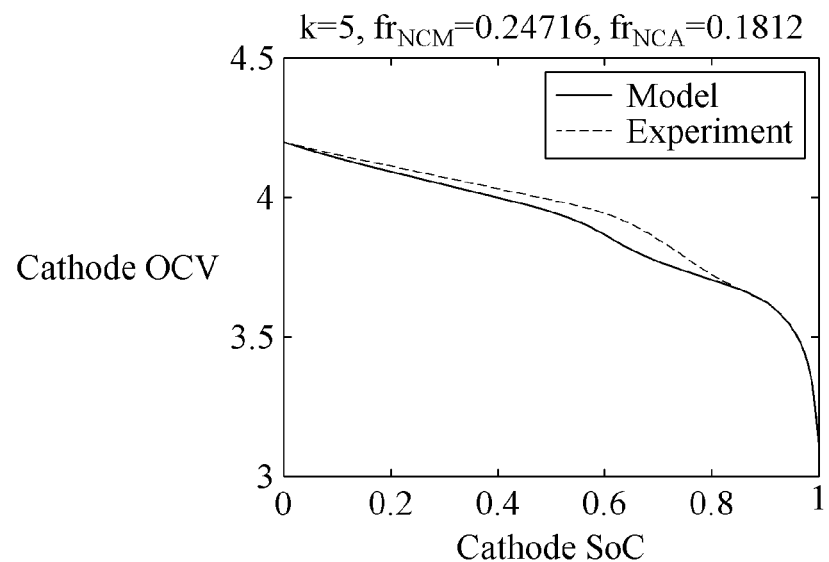
Figure 2C:
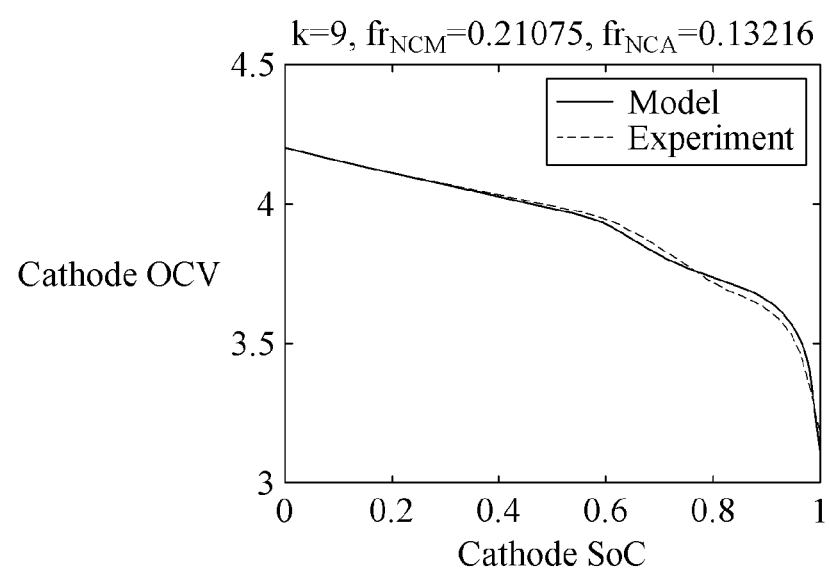
Figure 2D:
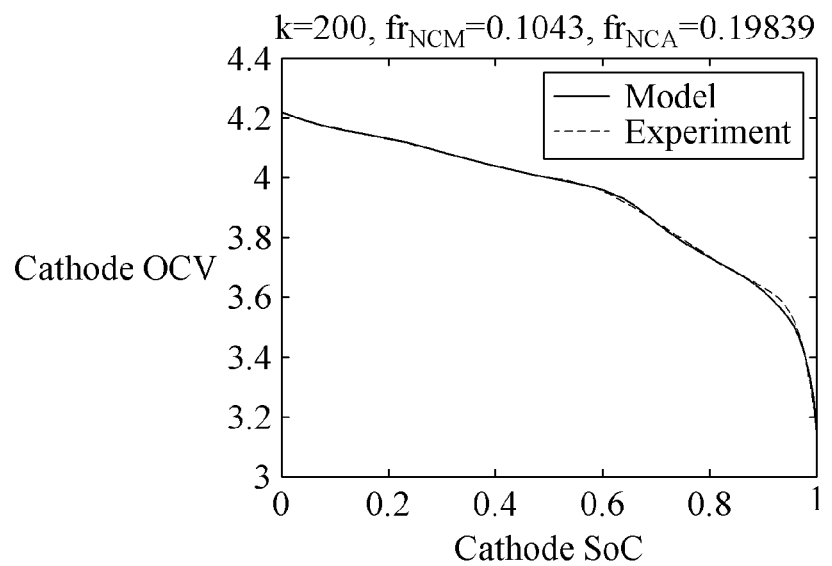

Referring to FIGS. 2A to 2D, the cathode includes, e.g., three components, a fraction of each of the three components is initially regarded to be ⅓. In an example, the three components include $LiMn_2O_4$ (LMO), $LiNi_{0.5}Mn_{0.3}Co_{0.2}O_2$ (NCM), and $LiNi_{0.8}Co_{0.15}Al_{0.05}O_2$ (NCA). Also, fractions of the three components are denoted by $fr_{LMO}$, $fr_{NCM}$ and $fr_{NCA}$, respectively. FIGS. 2A through 2D illustrate changes in OCVs with respect to $SoC^j$ shown after a single iteration, "5" iterations, "9" iterations, and "200" iterations, respectively. Here, an iteration refers to, e.g., determining $SoC^j$ using the composite cathode model and redetermined fractions of the components, wherein the fractions of components are redetermined based on a cost function indicating a difference between an $SoC^j$ calculated in a previous iteration and the experimental SoC of the battery. Referring to FIGS. 2A through 2D, as a number of iterations of a cost function increases, a curve of an OCV obtained using the composite cathode model is merged with a curve of an OCV obtained using an experimental method. That is, e.g., in comparing the curve of the OCV obtained using the composite cathode model in FIG. 2A (in which $SoC^j$ is calculated in a single iteration), the curve of the OCV obtained using the cathode model in FIG. 2B (in which $SoC^j$ is calculated after 5 iterations) is more closely merged with the curve of the OCV obtained using the experimental method than in FIG. 2A. As shown in FIG. 2D, matching of $SoC_{exp}^j$ and $SoC^j$ acquired after sufficient iterations, for example, "200" iterations, indicates that a fraction of each of the components in the cathode is accurately determined.

Figure 3A:
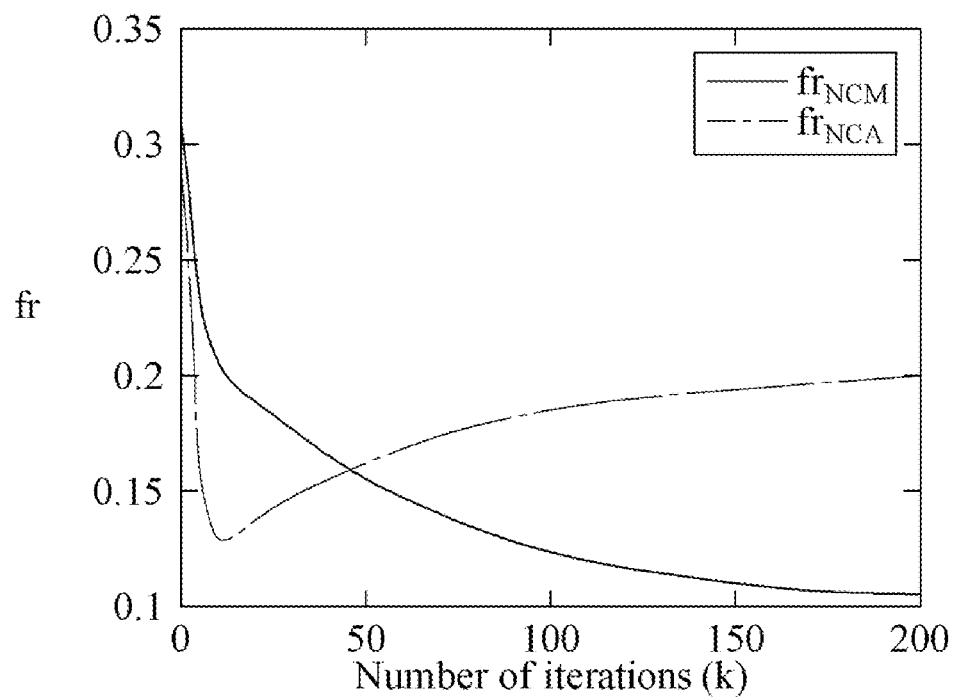
FIGS. 3A and 3B are graphs illustrating an example of an evolution of fractions of components of a cathode obtainable by iteratively determining fractions of components in an electrode of a battery, and an example of a minimization of a cost function based on an increase in a number of iterations, respectively.
Figure 3B:
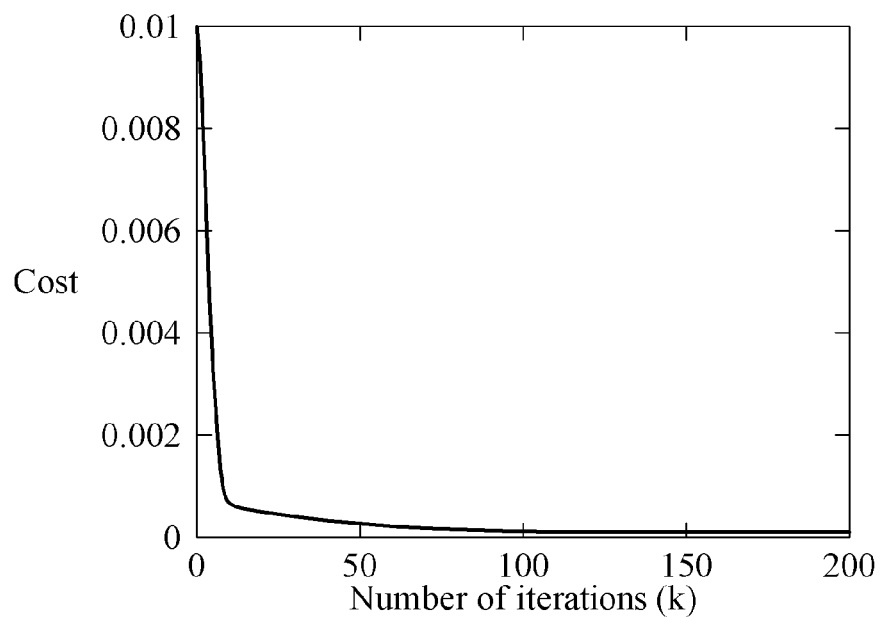

FIGS. 3A and 3B are graphs illustrating an example of an evolution of fractions of components of a cathode obtainable by iteratively determining fractions of components in an electrode of a battery, and an example of a minimization of a cost function based on an increase in a number of iterations, respectively.

FIG. 3A is a graph illustrating an evolution of fractions of components of a cathode with an iterative cost function. As discussed above with reference to FIGS. 2A through 2D, in the examples of FIGS. 2A through 2D, the cathode includes three components, a fraction of each of the three components is initially regarded to be ⅓. The three components may include $LiMn_2O_4$ (LMO), $LiNi_{0.5}Mn_{0.3}Co_{0.2}O_2$ (NCM), and $LiNi_{0.8}Co_{0.15}Al_{0.05}O_2$ (NCA), as non-limiting examples.

Also, fractions of the three components are denoted by $fr_{LMO}$, $fr_{NCM}$ and $fr_{NCA}$, respectively.

As shown in FIG. 3A, a variation in each of $fr_{NCM}$ and $fr_{NCA}$ is depicted in association with the number of iterations. A value of $fr_{LMO}$ is determined from values of $fr_{NCM}$ and $fr_{NCA}$, and a sum of the fractions $fr_{LMO}$, $fr_{NCM}$ and $fr_{NCA}$ of the three components is equal to "1." Thus, referring to FIG. 2D, values of the fractions of the components estimated at "200" iterations in the example of FIG. 3A are determined as actual values of fractions of the components in the cathode.

FIG. 3B is a graph illustrating the minimization of the cost function based on the increase in the number of iterations. As shown in FIG. 3B, after "200" iterations, a value of the cost function approaches a minimum threshold. For example, through sufficient iterations to allow the value of the cost function to be less than or equal to the minimum threshold, values of fractions of components of a cathode are more accurately estimated using an example BMS using the composite cathode model of the present disclosure, compared to, e.g., a typical BMS using an equivalent circuit model or a typical BMS using a composite cathode model that does not utilize the cost function analysis of the present disclosure. Further, by more accurately estimating the values of the fractions of the components of the cathode the example BMS using the composite cathode model of the present disclosure more accurately estimates the battery SoC and the state of the battery.

Figure 4A:
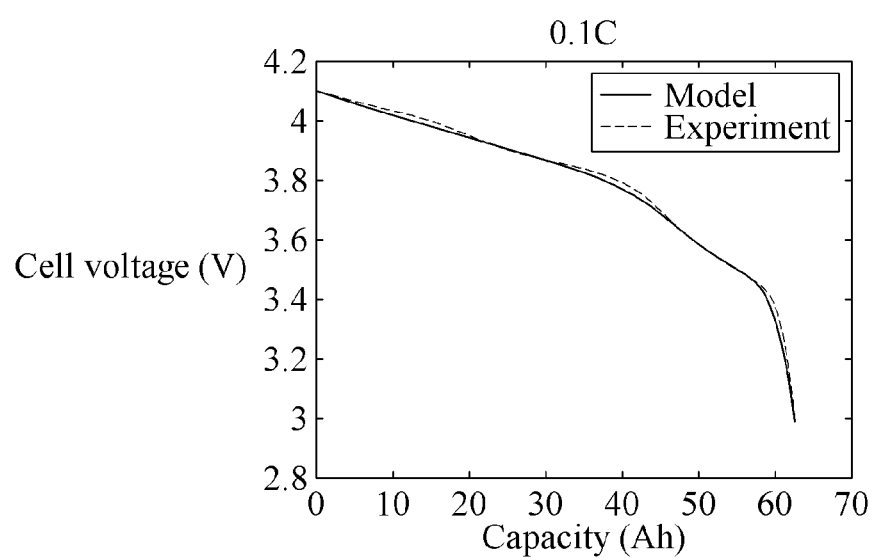
FIGS. 4A through 4C are graphs illustrating examples of predicted voltages of a battery cell at different C-rates.
Figure 4B:
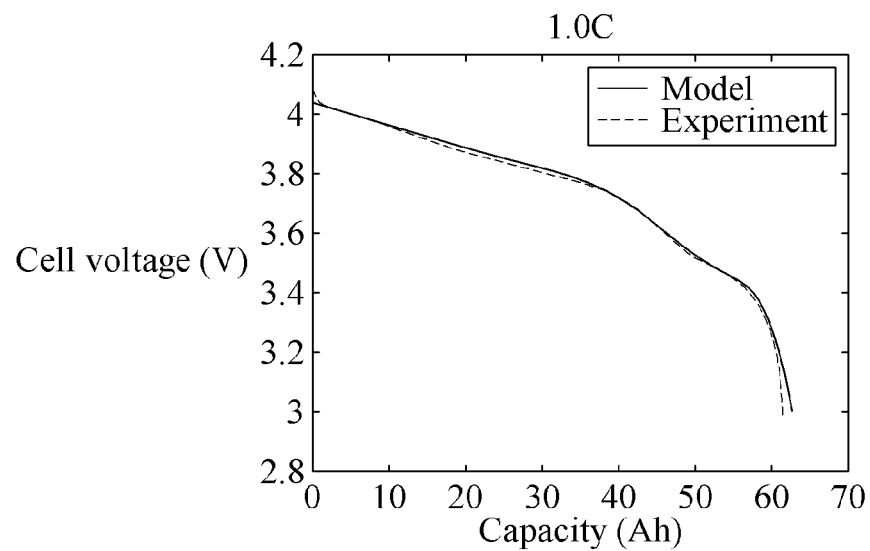
Figure 4C:
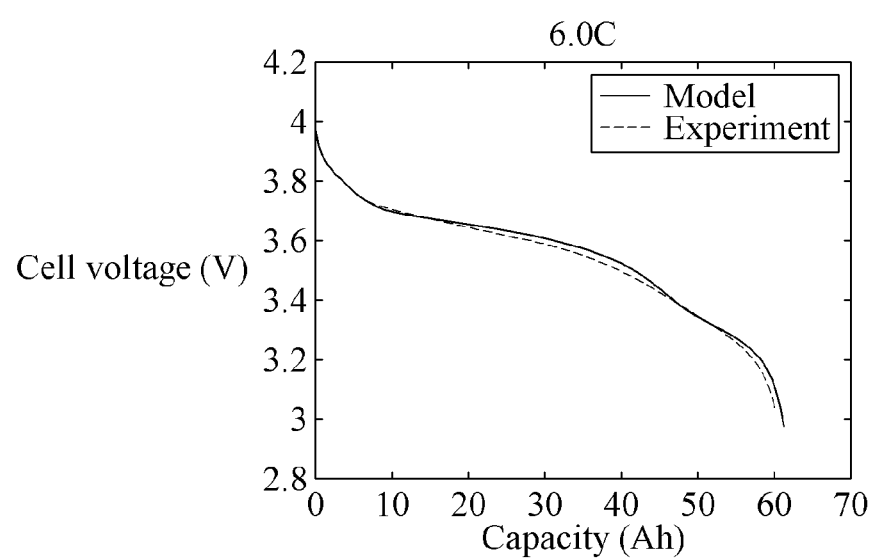
Figure 5A:
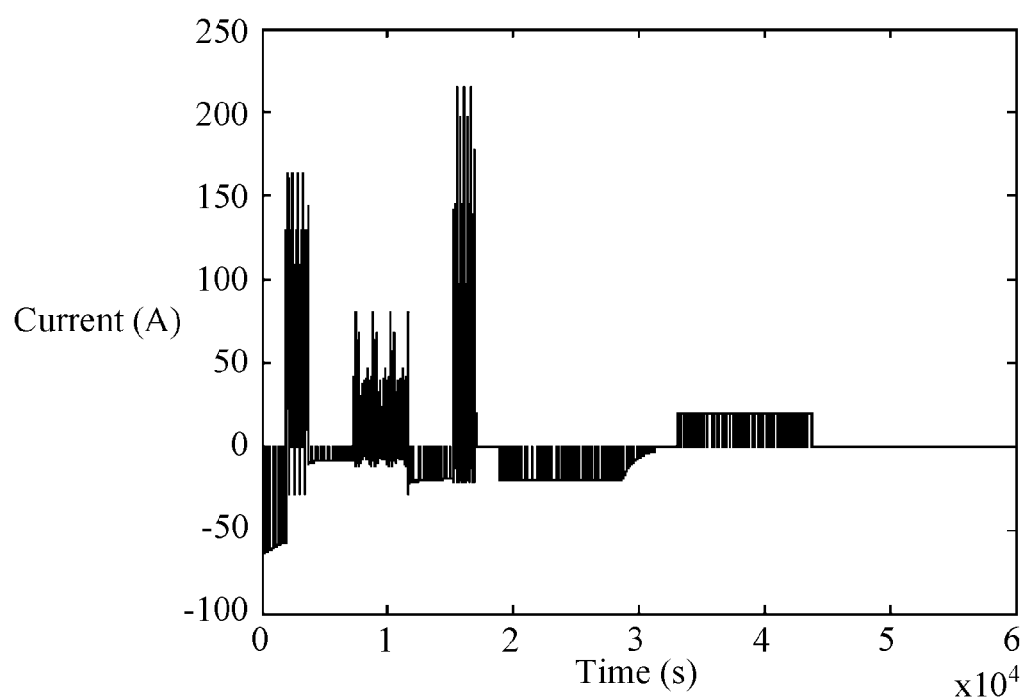
FIGS. 5A and 5B are graphs illustrating examples of a predicted current and a predicted voltage of a battery cell for a dynamic operation.
Figure 5B:
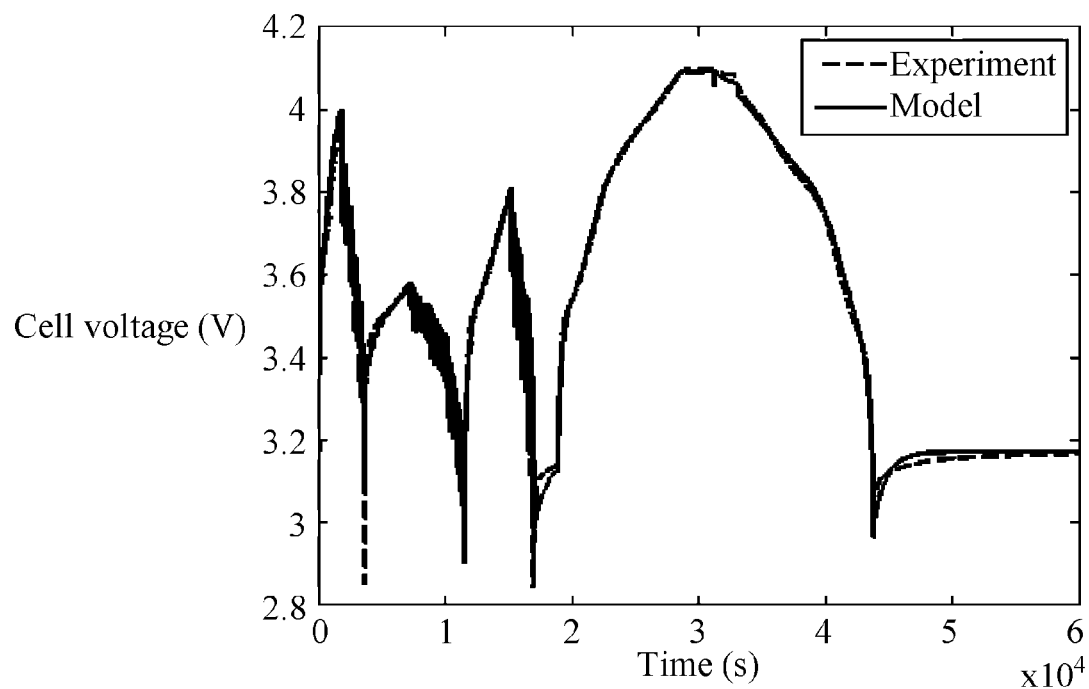
Figure 6A:
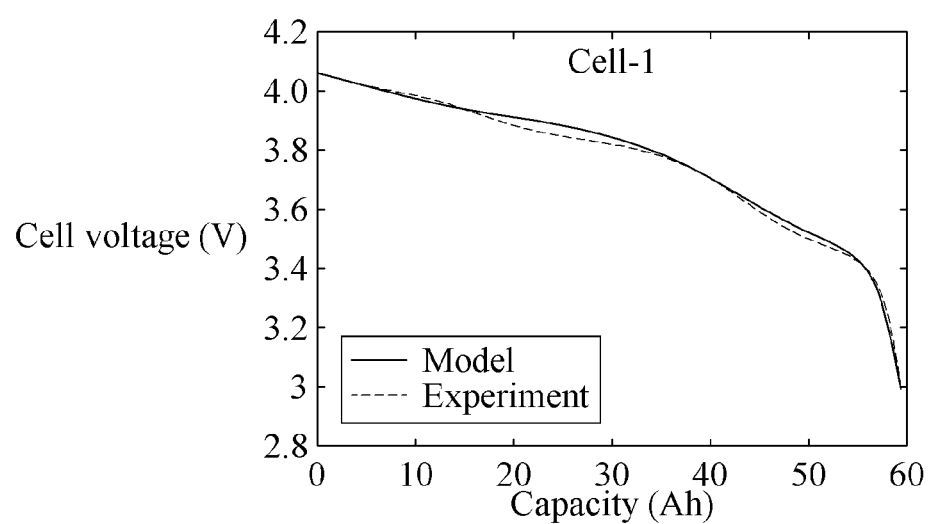
FIGS. 6A through 6D are graphs illustrating examples of results of prediction of voltages of all battery cells included in a battery pack using a determined voltage of one of the battery cells.
Figure 6B:
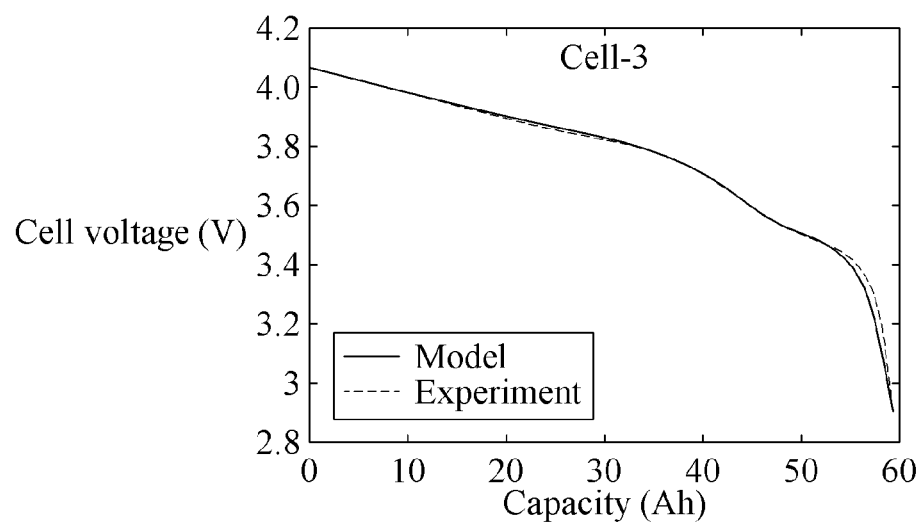
Figure 6C:
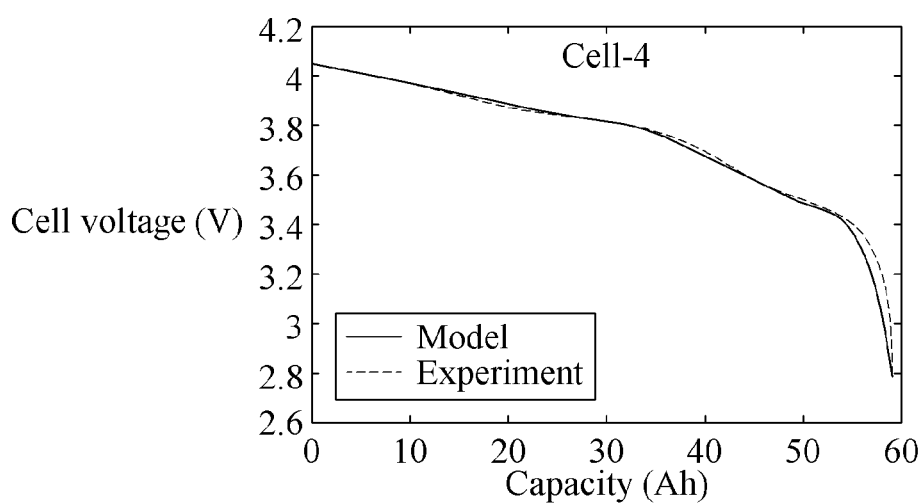
Figure 6D:
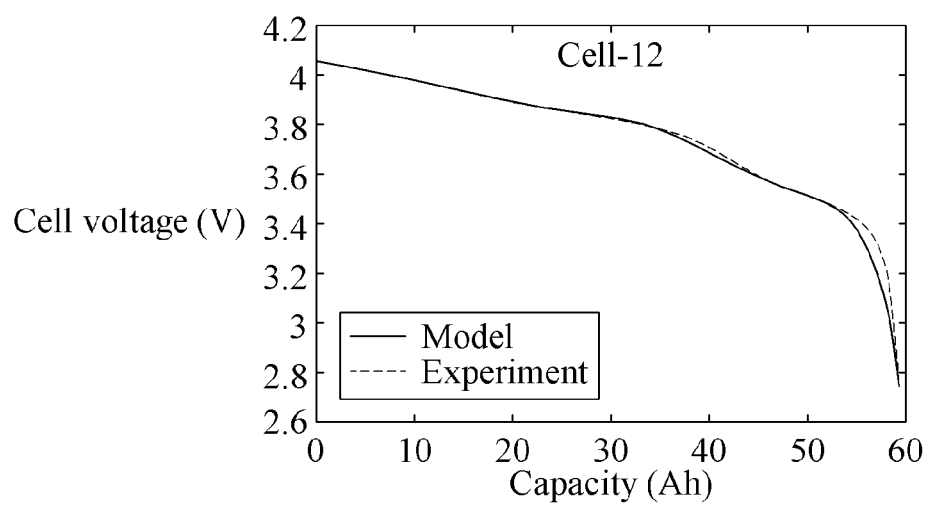

FIGS. 4A through 4C are graphs illustrating examples of predicted voltages of a battery cell at different C-rates, and FIGS. 5A and 5B are graphs illustrating examples of a predicted current and a predicted voltage of a battery cell for a dynamic operation. In the present disclosure, the C-rate indicates a rate of current for charging and discharging of a battery based on a capacity of the battery. Below, operations will be discussed with reference to the processor 110 and the BMS 100 of FIG. 1, for explanatory purposes, noting that examples are not limited thereto.

The processor 110 of FIG. 1 accurately predicts a state of a battery by implementing a composite cathode model on a ROM. FIGS. 4A through 4C illustrate a change in a voltage of a battery cell in a C-rate range of 0.1 C to 6.0 C. Referring to FIGS. 4A through 4C, a change in the voltage of the battery cell predicted at various C-rates using the composite cathode model is almost matched to a change in the voltage of the battery cell obtained by an experiment.

Referring to FIGS. 5A and 5B, the voltage and the current of the battery cell predicted using the composite cathode model of the present disclosure based on the dynamic operation are almost identical to a voltage and a current of the battery cell obtained by an experiment based on the dynamic operation.

FIGS. 6A through 6D are graphs illustrating examples of results of prediction of voltages of all battery cells included in a battery pack using a determined voltage of one of the battery cells. Below, operations will be discussed with reference to the processor 110 and the BMS 100 of FIG. 1, for explanatory purposes, noting that examples are not limited thereto.

For example, when a battery pack (e.g., corresponding to battery 120 as a non-limiting example) includes "12" battery cells that are connected in series and that operate at a C-rate of 0.33 C, the battery cells are numbered from cell-1 to cell-12. The processor 110 of FIG. 1 determines a parameter, for example, a voltage, a current, or an SoC of the cell-1, and predicts a state of the cell-1. Also, the cell-1 in the predicted state is regarded as a reference battery cell to predict states of the other battery cells. For example, based on determined parameters of the cell-1, parameters of the other battery cells are determined. In this example, a state of the cell-1 is predicted using a ROM.

FIGS. 6A through 6D show voltages of the cell-1, cell-3, cell-4 and cell-12, respectively. $SoC^j$ determined using a composite cathode model is implemented on a ROM to determine the voltage of the cell-1. The voltage of the cell-1 is denoted by $\overline{V}$, and a voltage of an i-th battery cell included in the battery pack is determined using Equation 4 shown below.

Equation 4:
$$V_i = \overline{V} + \frac{\partial V}{\partial SoC^o} \Delta SoC_i^0 + \frac{\partial V}{\partial \varepsilon} \Delta \varepsilon_i$$

In Equation 4, $\Delta SoC_i^0$ and $\Delta \varepsilon_i$ denote a change in an SoC and a change in an active material between the cell-1 and the i-th battery cell, respectively. A value of each of $\Delta SoC_i^0$ and $\Delta \varepsilon_i$ is experimentally determined.

The processor 110 uses an SoC and an active material of the cell-1, that is, the reference battery cell, to predict voltages of the other battery cells in the battery pack. For example, to predict the voltages of the other battery cells, the processor 110 simplifies $$\frac{\partial V}{\partial SoC^o} \text{ and } \frac{\partial V}{\partial \varepsilon}$$

in Equation 4, to obtain Equation 5 shown below.

Equation 5:
$$V_i = \overline{V} + \frac{\partial OCV}{\partial SoC} \Delta SoC_i^0 + \frac{\partial OCV}{\partial SoC} \frac{SoC^o - SoC}{\varepsilon} \Delta \varepsilon_i$$

The processor 110 predicts the voltages of the other battery cells in the battery pack using Equation 5. Referring to FIGS. 6A through 6D, voltages of the other battery cells predicted using the composite cathode model of the present disclosure are almost identical to voltages of the other battery cells obtained by an experiment.

Figure 7:
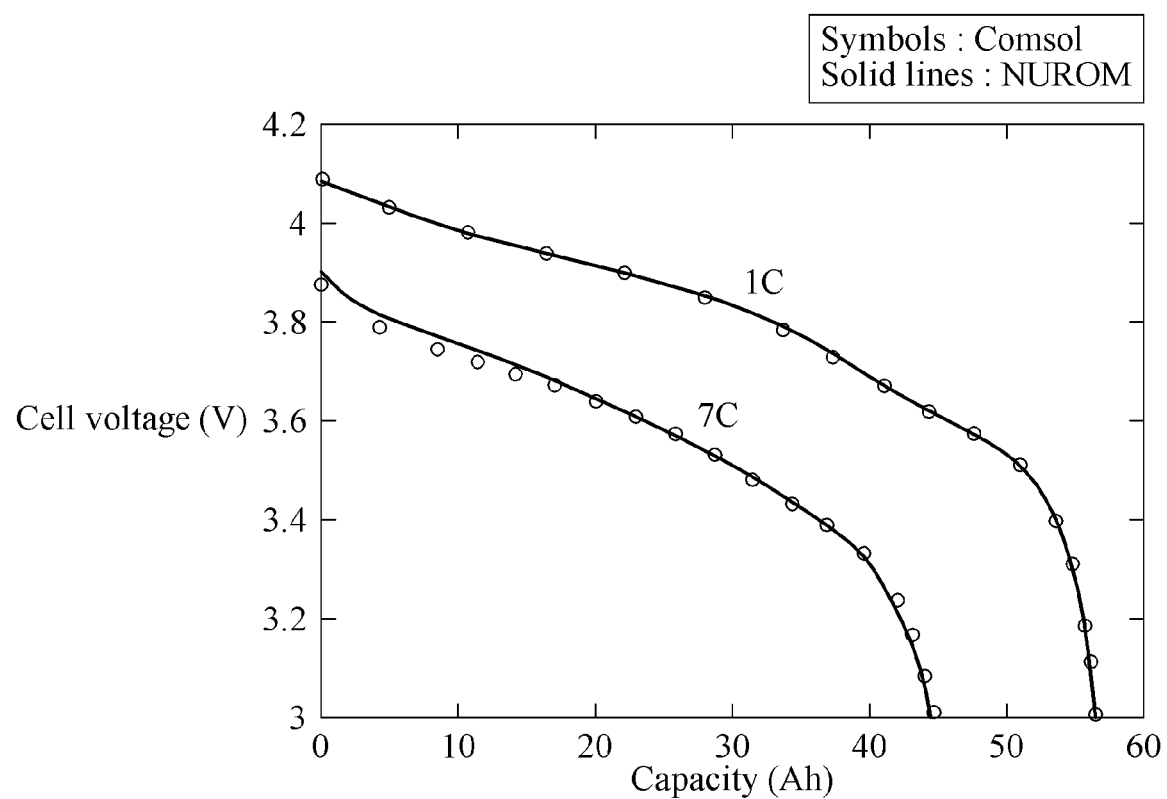
FIG. 7 is a graph illustrating an example of a predicted voltage of a battery cell at a relatively high C-rate.

FIG. 7 is a graph illustrating an example of a predicted voltage of a battery cell at a relatively high C-rate.

In an existing ROM, a reaction rate based on a thickness of an electrode is regarded to be uniform. For example, in a negative electrode, that is, an anode, an intercalation rate and/or de-intercalation rate $j_n(x,t)$ of Li-ions in a unit reaction area of the ROM is defined as shown in Equation 6 below.

Equation 6:

$$j_n(x, t) = \langle j_n \rangle(t) = \frac{I(t)}{a_n F l_n}$$

In Equation 6, I(t) denotes a current per unit cross-sectional area of a battery cell, $a_n$ denotes a surface area of an active material per unit volume of the anode, F denotes a Faraday constant, and $l_n$ denotes a thickness of the anode.

However, when a reaction rate based on the thickness of the electrode is assumed to be uniform at a higher C-rate, a state of the battery is inaccurately predicted. Thus, to accurately predict the state of the battery, factors that may have an influence on a non-uniformity of the reaction rate need to be taken into consideration. Also, the state of the battery determined based on the non-uniformity of the reaction rate is represented as a "Non-Uniform ROM (NUROM)." An intercalation rate and/or de-intercalation rate of Li-ions in a unit reaction area based on a change due to a non-uniform reaction rate, that is, based on the NUROM is defined as shown in Equation 7 below.

Equation 7:

$$j_n(x, t) = \frac{I(t)}{a_n F l_n} \exp\left[d_{n1}\left(\frac{x}{l_n} - \frac{1}{d_{n2}}\right)\right]$$

In Equation 7, x denotes a position in a through-plane direction, and $d_{n1}$, $d_{n2}$ denote functions of a local SoC, an electrolyte concentration and a current density. Referring to Equation 7, a reaction rate exponentially varies.

A voltage of a battery cell is obtained using an experimental method, that is, Comsol. Referring to FIG. 7, a change in a voltage of a battery cell obtained using the NUROM at C-rates of 1 C and 7 C, and a change in a voltage of a battery cell obtained using the Comsol are closely matched.

FIGS. 8A through 8D are graphs illustrating examples of a prediction of a local SoC and a prediction of an electrolyte concentration at a C-rate of 7 C, and examples of a prediction of a reaction rate for each of an anode and a cathode at the C-rate of 7 C.

Figure 8A:
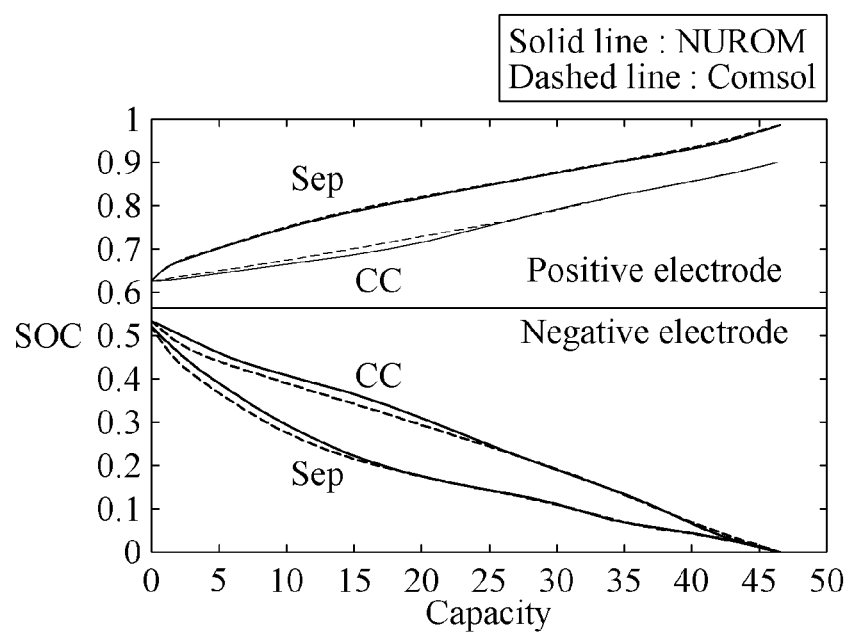
FIGS. 8A through 8D are graphs illustrating examples of a prediction of a local state of charge (SoC) and a prediction of an electrolyte concentration at a C-rate of 7 C, and examples of a prediction of a reaction rate for each of an anode and a cathode at the C-rate of 7 C.
Figure 8B:
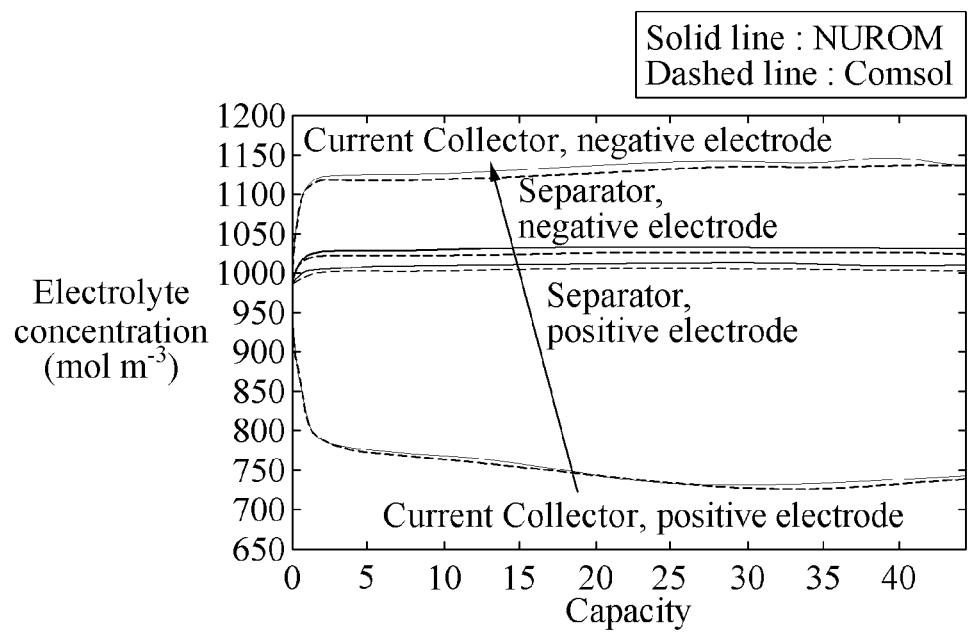

In an example, FIGS. 8A and 8B are graphs illustrating a prediction of a local SoC and an electrolyte concentration at a C-rate of 7 C, respectively. In this example, an electrolyte is Li, however, the present disclosure is not limited thereto. Accordingly, other types of electrolytes are used. Plots of FIGS. 8A and 8B show changes in the local SoC at a current collector CC and a separator Sep, and changes in a Li-ion concentration at the current collector CC and the separator Sep, for each of an anode and a cathode. Also, the plots of FIGS. 8A and 8B are acquired using Equation 7 and an experimental method, and are closely matched.

Figure 8C:
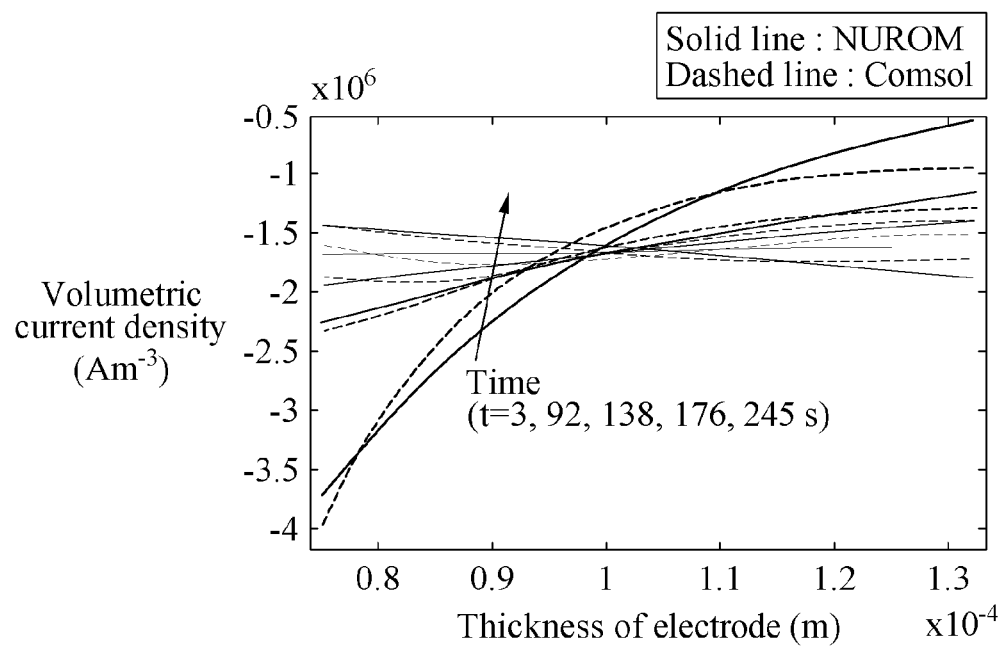
Figure 8D:
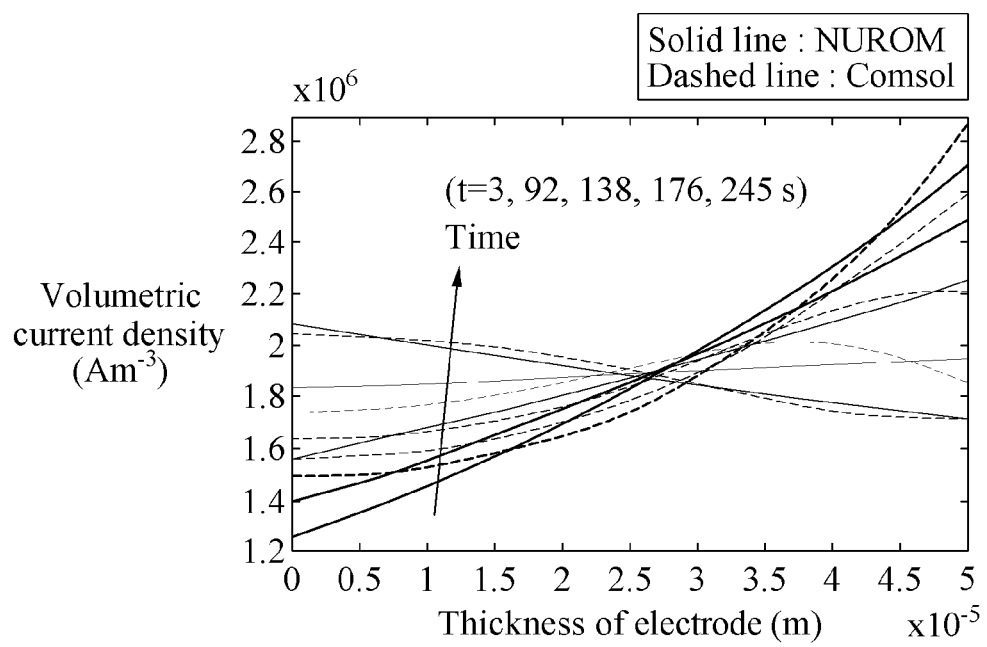

In another example, FIGS. 8C and 8D are graphs illustrating a prediction of a reaction rate for each of an anode and a cathode at the C-rate of 7 C. Plots of FIGS. 8C and 8D show a change in a current density based on a change in a reaction rate based on a thickness of an electrode at the C-rate of 7 C. It is confirmed that a highest non-uniformity of the reaction rate is shown at 7 C. The plots are acquired using the NUROM based on Equation 7, and the experimental method, that is, Comsol, and are closely matched.

FIG. 9 is a flowchart illustrating an example of a battery management method. Below, operations will be discussed with reference to the processor 110 and the BMS 100 of FIG. 1, for explanatory purposes, noting that examples are not limited thereto.

Referring to FIG. 9, in operation 910, the processor 110 of FIG. 1 iteratively determines fractions of components in an electrode of a battery using machine learning.

In operation 920, the processor 110 calculates a composite SoC of the battery by applying the iteratively determined fractions of the components to a composite cathode model used to predict a state of the battery.

For example, a voltage range ($V_{max}$, $V_{min}$) of the battery is divided into "n" voltage with equal levels. In this example, an OCV is denoted by $V^j$ (j=1, 2, ..., n). When a cathode is assumed to include "m" components, an individual SoC of a component "i" at the OCV $V^j$ is denoted by $SoC_i^j$, and $SoC_i^j$ is regarded to be known.

Also, a composite SoC at $V^j$ in which all the "m" components are taken into consideration is denoted by $SoC^j$, is calculated using the composite cathode model, and is expressed using Equation 1 described above.

In operation 930, the processor 110 identifies a cost function that corresponds to a difference between the calculated composite SoC and an experimental SoC derived through an experiment.

For example, the processor 110 defines an experimental SoC at the OCV $V^j$ that may be obtained using an experimental method, as $SoC_{exp}^j$. Also, the processor 110 compares $SoC^j$ calculated using the composite cathode model to $SoC_{exp}^j$ acquired using the experimental method, to verify a validity of the fraction $fr_i$ of the component "i". The processor 110 identifies, based on a comparison result, a cost function corresponding to a difference between the calculated composite SoC $SoC^j$ and the experimental SoC $SoC_{exp}^j$ derived through an experiment.

For example, the cost function is defined as shown in Equation 2 described above.

In operation 940, the processor 110 determines whether to redetermine the fractions of the components in the electrode of the battery, by comparing the identified cost function to a predetermined minimum threshold. In an example, when the identified cost function is less than or equal to the minimum threshold, the processor 110 determines the iteratively determined fractions of the components as actual fractions of the components.

In operation 950, the processor 110 predicts the state of the battery based on the composite SoC calculated in operation 920. In a non-limiting example, operation 950 may also include managing the battery based on the predicted state of the battery. Managing the battery may include any one or any combination of controlling battery output or input voltage or current, controlling charging or discharging of the battery, controlling balancing of the battery, or controlling an output of the predicted state of the battery to an external device or interface, as non-limiting examples.

In another example, when the identified cost function is greater than the minimum threshold, the processor 110 determines to redetermine the fractions of the components in the electrode of the battery in operation 901. In this example, in response to a determination to redetermine the fractions of the components, the processor 110 redetermines the fractions of the components based on previously determined fractions of the components, a rate of change in the previously determined fractions, a rate of change in a cost function identified based on the previously determined fractions, and a learning rate.

According to examples, as described in detail above, an example battery management methods and systems of the present disclosure may provide a physics-based BMS configured to predict a state of a battery under different operating conditions.

According to examples, as described in detail above, an example battery management methods and systems of the present disclosure may determine a fraction of at least one component in an electrode of a battery, using machine learning.

According to examples, as described in detail above, an example battery management methods and systems of the present disclosure may implement a voltage average composite cathode model on a ROM.

According to examples, as described in detail above, an example battery management methods and systems of the present disclosure may predict states of all battery cells included in a battery pack by determining a state of one of the battery cells.

According to examples, as described in detail above, an example battery management methods and systems of the present disclosure may more accurately predict a state of a battery at a relatively high C-rate based on a non-uniformity of a reaction rate at the relatively high C-rate.

The BMS 100, the processor 110, the battery 120, and other apparatuses, modules, devices, and other components described herein with respect to FIGS. 1 through 9 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions used herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD−RWs, CD+RWs, DVD-ROMs, DVD−Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented battery management method, the method comprising:
   determining a composite state of charge (SoC) of a battery by applying fractions of components in an electrode of the battery to a composite cathode model;
   redetermining the composite SoC based on a comparison of the composite SoC and a predetermined composite SoC of the battery; and
   predicting a state of the battery based on the redetermined composite SoC.

2. The method of claim 1, wherein the redetermining of the composite SoC is based on the fractions of the components, a concentration of each of the components, and an individual SoC of each of the components.

3. The method of claim 1, wherein the redetermining of the composite SoC comprises:
   identifying a result of a cost function corresponding to a difference between the determined composite SoC and the predetermined composite SoC, the predetermined composite SoC being an experimental SoC of the battery that is derived through an experiment; and
   determining whether to redetermine the fractions of the components, by comparing the identified result of the cost function to a predetermined threshold.

4. The method of claim 3, wherein the determining of whether to redetermine the fractions of the components comprises determining the fractions of the components as accurately-determined fractions of the components, in response to the identified result of the cost function being less than or equal to the threshold.

5. The method of claim 3, wherein
   the determining of whether to redetermine the fraction of the components comprises determining to redetermine the fractions of the components, in response to the identified result of the cost function being greater than the threshold, and
   the redetermining of the fractions of the components comprises redetermining the fractions of the components based on the fractions of the components, a rate of change in the fractions, a rate of change in previously-determined results of the cost function identified based on the fractions, and a learning rate, in response to the determination to redetermine the fractions of the components.

6. The method of claim 1, wherein the predicting of the state of the battery comprises predicting states of batteries other than the battery in a battery pack.

7. The method of claim 6, wherein the predicting of the states of the other batteries comprises predicting the states of the other batteries based on a change in an active material and a change in a composite SoC between the battery and the other batteries.

8. The method of claim 1, further comprising:
   calculating at least one of an intercalation rate and a deintercalation rate of lithium (Li)-ions based on a non-uniformity of a reaction rate based on a thickness of the electrode,
   wherein the predicting of the state of the battery comprises predicting the state of the battery based on either one or both of the calculated intercalation rate and the calculated deintercalation rate.

9. The method of claim 1, further comprising managing the battery based on the predicted state of the battery.

10. A non-transitory computer-readable recording medium storing instructions that, when executed by one or more processors, configure the one or more processors to perform the method of claim 1.

11. A battery management system, the system comprising:
    one or more processors configured to:
       determine a composite state of charge (SoC) of a battery by applying fractions of components in an electrode of the battery to a composite cathode model;
       redetermine the composite SoC based on a comparison of the composite SoC and a predetermined composite SoC of the battery; and
       predict a state of the battery based on the redetermined composite SoC.

12. The system of claim 11, wherein, for the redetermining of the composite SoC, the one or more processors are configured to redetermine the composite SoC based on the fractions of the components, a concentration of each of the components, and an individual SoC of each of the components.

13. The system of claim 11, wherein, for the redetermining of the composite SoC, the one or more processors are configured to:
    identify result of a cost function corresponding to a difference between the determined composite SoC and the predetermined composite SoC, the predetermined composite SoC being an experimental SoC of the battery that is derived through an experiment; and
    determine whether to redetermine the fractions of the components, by comparing the identified result of the cost function to a predetermined threshold.

14. The system of claim 13, wherein, for the determining of whether to redetermine the fractions of the components, the one or more processors are configured to determine the fractions of the components as accurately-determined fractions of the components, in response to the identified result of the cost function being less than or equal to the threshold.

15. The system of claim 13, wherein the one or more processors are configured to:
    for the determining of whether to redetermine the fraction of the components, determine to redetermine the fractions of the components, in response to the identified result of the cost function being greater than the minimum threshold; and redetermine the fractions of the components based on the fractions of the components, a rate of change in the fractions, a rate of change in previously-determined results of the cost function identified based on the fractions, and a learning rate, in response to the determination to redetermine the fractions of the components.

16. The system of claim 11, wherein the one or more processors are configured to predict states of batteries other than the battery in a battery pack.

17. The system of claim 16, wherein the one or more processors are configured to predict the states of the other batteries based on a change in an active material and a change in a composite SoC between the battery and the other batteries.

18. The system of claim 11, wherein the one or more processors are configured to:
calculate at least one of an intercalation rate and a deintercalation rate of lithium (Li)-ions based on a non-uniformity of a reaction rate based on a thickness of the electrode; and
predict the state of the battery based either one or both of the calculated intercalation rate and the calculated deintercalation rate.

19. The system of claim 11, further comprising memory storing instructions that, wherein when executed by the one or more processors, configure the one or more processors to perform the determination, the redetermination, and the prediction.

20. A battery management method, the method comprising:
iteratively applying fractions of components in an electrode of a battery to a composite electrode model to determine a composite state of charge (SoC) of the battery, and updating the fractions of the components based on a comparison of the composite SoC and a predetermined composite SoC of the battery;
determining conclusory fractions of the components based on the iterative applying and updating of the fractions of the components; and
determining a conclusory composite SoC of the battery by applying the determined conclusory fractions of the components to the composite electrode model.

21. The method of claim 20, wherein
the determining of the conclusory fractions of the components comprises determining fractions of the components, from among the iteratively updated fractions of the components, to be the conclusory fractions of the components based on a result of a cost function of the composite electrode model with the updated fractions of the components applied, and
the cost function is based on the difference between the composite SoC determined by applying the updated fractions of components to the composite electrode model and the predetermined composite SoC predetermined by experiment.

22. A battery management method, the method comprising:
determining a preliminary composite state of charge (SoC) of a battery by applying fractions of components in an electrode of the battery to a composite electrode model;
determining a result of a cost function based on a difference between the determined preliminary composite SoC and an SoC predetermined by experiment;
updating the fractions of the components based on a comparison of the result of the cost function to a predetermined threshold; and
determining a conclusory composite SoC of the battery by applying the updated fractions of components in an electrode of the battery to the composite electrode model.

* * * * *